US00RE36089E

United States Patent [19]

Ooishi et al.

[11] E Patent Number: Re. 36,089

[45] Reissued Date of Patent: Feb. 9, 1999

[54] COLUMN SELECTING CIRCUIT IN SEMICONDUCTOR MEMORY DEVICE

[75] Inventors: Tsukasa Ooishi; Kazutami Arimoto; Hideto Hidaka; Masanori Hayashikoshi; Shinji Kawai; Mikio Asakura; Masaki Tsukude; Katsuhiro Suma; Shigeki Tomishima; Kazuyasu Fujishima, all of Itami, Japan

[73] Assignee: Mitsubishi Denki Kabushiki Kaisha, Tokyo, Japan

[21] Appl. No.: 652,008

[22] Filed: May 23, 1996

Related U.S. Patent Documents

Reissue of:

[64] Patent No.: 5,315,548
Issued: May 24, 1994
Appl. No.: 900,368
Filed: Jun. 18, 1992

[30] Foreign Application Priority Data

Jun. 20, 1991 [JP] Japan ..... 3-148968

[51] Int. Cl.[6] ..... G11C 7/00

[52] U.S. Cl. ..... 365/189.01; 365/230.03; 365/230.06; 365/230.08; 365/230.01

[58] Field of Search ..... 365/189.01, 230.01, 365/230.06, 230.03, 230.08

[56] References Cited

U.S. PATENT DOCUMENTS 4,429,374 1/1984 Tanimura .
4,855,957 8/1989 Nogami .
5,040,152 8/1991 Voss et al. .
5,210,723 5/1993 Bates et al. .
5,315,548 5/1994 Ooishi ..... 365/189.01

FOREIGN PATENT DOCUMENTS 4101396 3/1992 Germany .

OTHER PUBLICATIONS

"An Experimental 16Mb CMOS DRAM Chip with a 100 MHz Serial Read/Write Mode", Shigeyoshi Watanabe et al., 1988 IEEE International Solid State Circuits Conference, Feb. 1988, pp. 248–249.

*Primary Examiner*—Viet Q. Nguyen
*Attorney, Agent, or Firm*—McDermott, Will & Emery

[57] ABSTRACT

Column address A0–A11 is once predecoded by a first predecoder PD1, a second predecoder PD2, and a CDE buffer CDB and then applied to a column decoder CD. Column decoder CD selectively drives one of a plurality of column selecting lines CSL on the basis of the applied predecoded signals. This causes corresponding bit lines in respective memory cell arrays MCA1–MCA4 to be simultaneously selected. Column decoder CD includes a plurality of column drivers corresponding to the plurality of column selecting lines, and the column drivers are divided into a plurality of groups. The predecoded signals applied from second predecoder PD2 and CDE buffer CDB to column decoder CD are generated independently for respective groups, and signal lines for them are also distributed to respective groups. This causes the length of wiring of each predecoded signal line to be shortened.

17 Claims, 16 Drawing Sheets

COLUMN SELECTING CIRCUIT IN SEMICONDUCTOR MEMORY DEVICE

Matter enclosed in heavy brackets [ ] appears in the original patent but forms no part of this reissue specification; matter printed in italics indicates the additions made by reissue.

BACKGROUND OF THE INVENTION

1. Field of the Invention

The present invention relates to column selecting circuits in semiconductor memory devices, and, more particularly, to a column selecting circuit in a semiconductor memory device in which a memory cell array is divided into a plurality of blocks, and corresponding bit lines in respective blocks are simultaneously selected.

2. Description of the Background Art

FIG. 9 is a block diagram illustrating a structure of a conventional semiconductor memory device (for example, a dynamic RAM). FIG. 9 illustrates only a memory cell array and a column selecting system for the sake of simplicity. A memory cell array MCA is provided with a plurality of word lines, a plurality of bit line pairs arranged crossing the word lines at right angles, and a plurality of memory cells arranged at respective crossings of the word lines and the bit line pairs. A sense amplifier group SAG includes a plurality of sense amplifiers provided for respective bit line pairs. Each sense amplifier amplifies data read from a memory cell to a bit line pair or data transmitted from the outside to a bit line pair. A column decoder CD decodes an externally applied column address and provides a signal for selecting one bit line pair out of a plurality of bit line pairs.

There is a tendency for the memory capacity of a semiconductor memory device to be further increased with the rapid advance in semiconductor technology in recent years. This causes the length of a bit line to be longer and the number of memory cells connected to one bit line to be increased. As a result, there has been a problem of capacitance of a bit line being increased and the speed of reading and writing being decreased.

A semiconductor memory device is proposed, in which a memory cell array is divided into a plurality of blocks, and selection of a bit line is individually carried out in each block to reduce capacitance of a bit line. For example, a semiconductor memory device illustrated in FIG. 10 includes a memory cell array divided into four blocks, i.e. memory cell arrays MCA1–MCA4. Each of memory cell arrays MCA1–MCA4 includes a sense amplifier group SAG1–SAG4 and a column decoder CD1–CD4. A column address is once supplied as an input to a predecoder PD and is predecoded. Predecoded signals provided from predecoder PD are applied to column decoders CD1–CD4, respectively. Each of column decoders CD1–CD4 further decodes the applied predecoded signal and selects one bit line pair in the corresponding memory cell array. Predecoder PD serves to select one memory cell array out of memory cell arrays MCA1–MCA4.

Although it is possible to reduce capacitance of a bit line in the semiconductor memory device illustrated in FIG. 10, it is necessary to provide a column decoder for each memory cell array, and there is another problem that the area of circuits is increased.

A semiconductor memory device is proposed, in which the column decoders which were provided individually in respective memory cell arrays are implemented to be a common one to reduce the area of the circuits. FIG. 11 is a block diagram illustrating an example of such a semiconductor memory device. Each memory cell array is provided with a plurality of common column selecting lines CSL. A column decoder CD selectively drives one of the plurality of column selecting lines CSL on the basis of an externally applied column address. This causes corresponding bit line pairs in respective memory cell arrays MCA1–MCA4 to be simultaneously selected. Accordingly, data are simultaneously provided from sense amplifier groups SAG1–SAG4, and one of the data is selected by a selector SEL and provided as an output.

FIG. 12 is a block diagram illustrating a further detailed structure of the conventional semiconductor memory device illustrated in FIG. 11. A column address buffer CAB includes a plurality of one-bit buffers BB0–BB11 and converts externally applied column addresses A0–A11 into appropriate signals CA0, /CA0–CA11, /CA11 to be used in the semiconductor memory device, as illustrated in FIG. 13. Signals CA2, /CA2–CA9, /CA9, and CA11, /CA11 are supplied to a predecoder PD and predecoded. As illustrated in FIG. 14, predecoder PD includes a plurality of subdecoders DC01–DC04 and provides predecoded signals Y4–Y23. Predecoded signals Y4–Y23 are supplied to a column decoder CD. As illustrated in FIG. 15, column decoder CD includes a plurality of column drivers DRV. One of predecoded signals Y4–Y7, one of predecoded signals Y8–Y11, one of predecoded signals Y12–Y15, and one of predecoded signals Y16–Y23 are applied to each column driver DRV. Each column driver DRV is activated and drives a corresponding column selecting line CSL when all the predecoded signals applied from predecoder PD are at an active level (for example, at a high or "H" level).

As illustrated in FIG. 16, each of memory cell arrays MCA1–MCA4 is provided with a plurality of word lines WL, a plurality of bit line pairs BL, /BL arranged to cross word lines WL at right angles, and memory cells MC arranged at respective crossings of the word lines and the bit line pairs. Each of sense amplifier groups SAG1–SAG4 includes sense amplifiers SA provided for respective bit line pairs in a corresponding memory cell array. Each sense amplifier SA is connected through a corresponding transfer gate TG to a corresponding input/output line pair IO, /IO. Each input/output line pair IO, /IO is connected to a selector SEL. Column selecting lines CSL are provided, for example, at a ratio of one column selecting line to four bit line pairs. Each column selecting line CSL is connected to gates of transistors constituting transfer gates TG of corresponding bit line pairs.

If one word line WL is selected by a row decoder not shown, stored data are read from the memory cells connected to the selected word line and transmitted to corresponding bit line pairs, respectively.

Subsequently, if one of column selecting lines CSL is driven by column decoder CD, four transfer gates TG are simultaneously turned on in respective memory cell arrays MCA1–MCA4. Therefore, four bit line pairs corresponding to the selected column selecting line CSL are selected in each of memory cell arrays MCA1–MCA4. The data read to each of the selected bit line pairs is transmitted through a corresponding sense amplifier SA, a transfer gate TG, and an input/output line pair IO, /IO to selector SEL.

Selector SEL selects a read data transmitted from one of the bit line pairs in one of the memory cell arrays on the basis of signals CA0, /CA0, CA1, /CA1, CA10, /CA10 applied from column address buffer CAB and provides it as an output.

As described above, according to a conventional semiconductor memory device illustrated in FIG. 12, corresponding bit line pairs in respective memory cell arrays MCA1–MCA4 are simultaneously selected by one common column decoder CD, so that the area of the circuits can be reduced in comparison with the semiconductor memory device including a column decoders for each memory cell array illustrated in FIG. 10.

According to the semiconductor memory device illustrated in FIG. 12, however, there is a problem of the wiring structure for predecoded signals Y4–Y23 between predecoder PD and column decoder CD. Specifically, as illustrated in FIG. 15 or FIG. 8, the conventional semiconductor memory device illustrated in FIG. 12 has all the signal lines for transmitting respective predecoded signals Y4–Y23 to column decoder CD arranged to cover the whole length of column decoder CD. Therefore, the length of wiring for each predecoded signal is made unnecessarily long, and capacitance of wiring is increased. As a result, delay in transmission of the predecoded signal is increased, and power consumption is also increased. In addition, the area of a layout for wiring for the predecoded signal is increased.

SUMMARY OF THE INVENTION

Accordingly, an object of the present invention is to provide a column selecting circuit in a semiconductor memory device, in which the area of a layout of a column selecting system in the semiconductor memory device can be reduced, high-speed operation is possible, and power consumption is reduced.

A column selecting circuit in a semiconductor memory device according to the present invention selects a bit line in a semiconductor memory device in which a memory cell array is divided into a plurality of blocks. Each block of the memory cell array includes a plurality of word lines, a plurality of bit lines arranged crossing the word lines, and plurality of memory cell arranged at respective crossings of the word lines and the bit lines. A column selecting circuit in a semiconductor memory device according to the present invention is provided with a plurality of column selecting lines for simultaneously selecting corresponding bit lines in respective blocks of a memory cell array, predecode means for predecoding an applied column address signal to provide a plurality of predecoded signals, column decode means for decoding the predecoded signals to selectively drive one of the plurality of column selecting lines, and predecoded signal wiring for transmitting the predecoded signals to column decode means. The decode means includes a plurality of column selecting line driving means provided for respective column selecting line for driving corresponding column selecting lines, respectively. The column selecting line driving means is divided into a plurality of groups, and the predecode means provides an independent predecoded signal for each group of the column selecting line driving means. Wiring for the predecoded signal has a wiring structure divided between groups of the column selecting line driving means.

According to the present invention, the column decode means selectively drives one of the plurality of column selecting lines on the basis of the predecoded signals from the predecode means, and corresponding bit lines in respective blocks of the memory cell array are simultaneously selected. The plurality of column selecting line driving means included in the decode means are divided into a plurality of groups, and the predecode means provides independent predecoded signals for respective groups of the column selecting line driving means. Therefore, the wiring for the predecoded signal has a wiring structure divided for each group of the column selecting line driving means. This causes the length of wiring for each predecoded signal to be shortened and the area of a layout to be reduced. In addition, capacitance of each predecoded signal line is reduced, and high-speed operation and low power consumption become possible.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
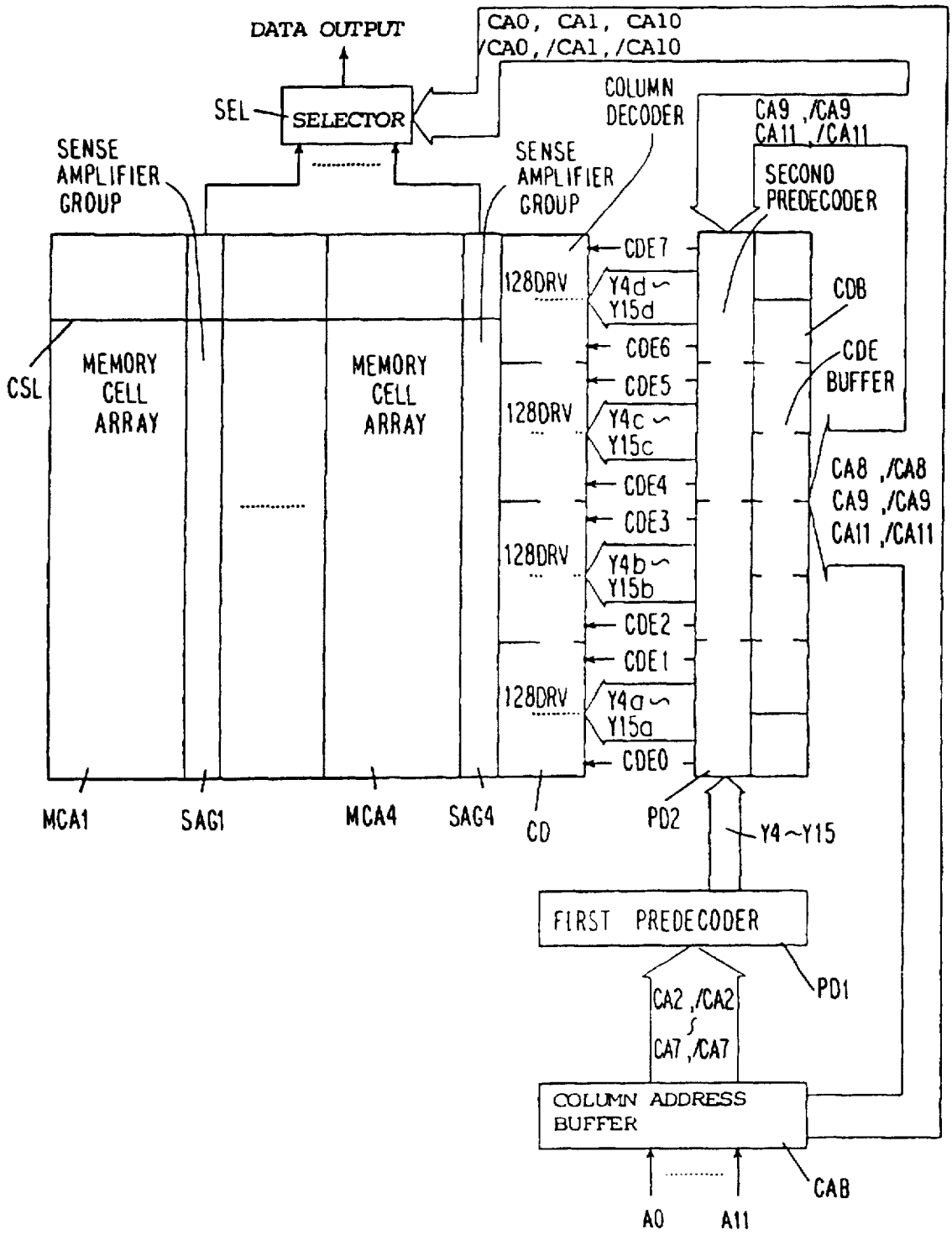
FIG. 1 is a block diagram illustrating a structure of an embodiment of the present invention.
Figure 2:
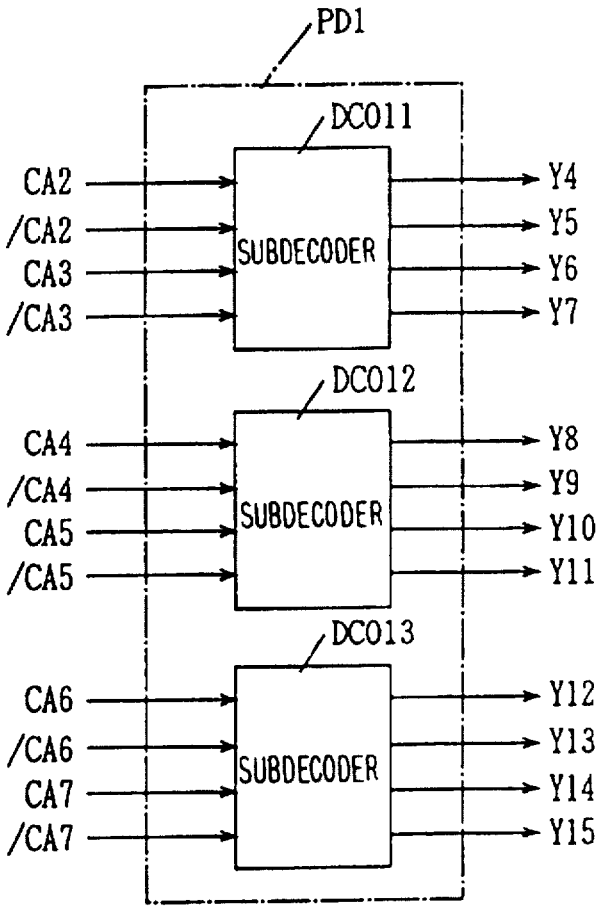
FIG. 2 is a block diagram illustrating a further detailed structure of the first predecoder in FIG. 1.
Figure 3:
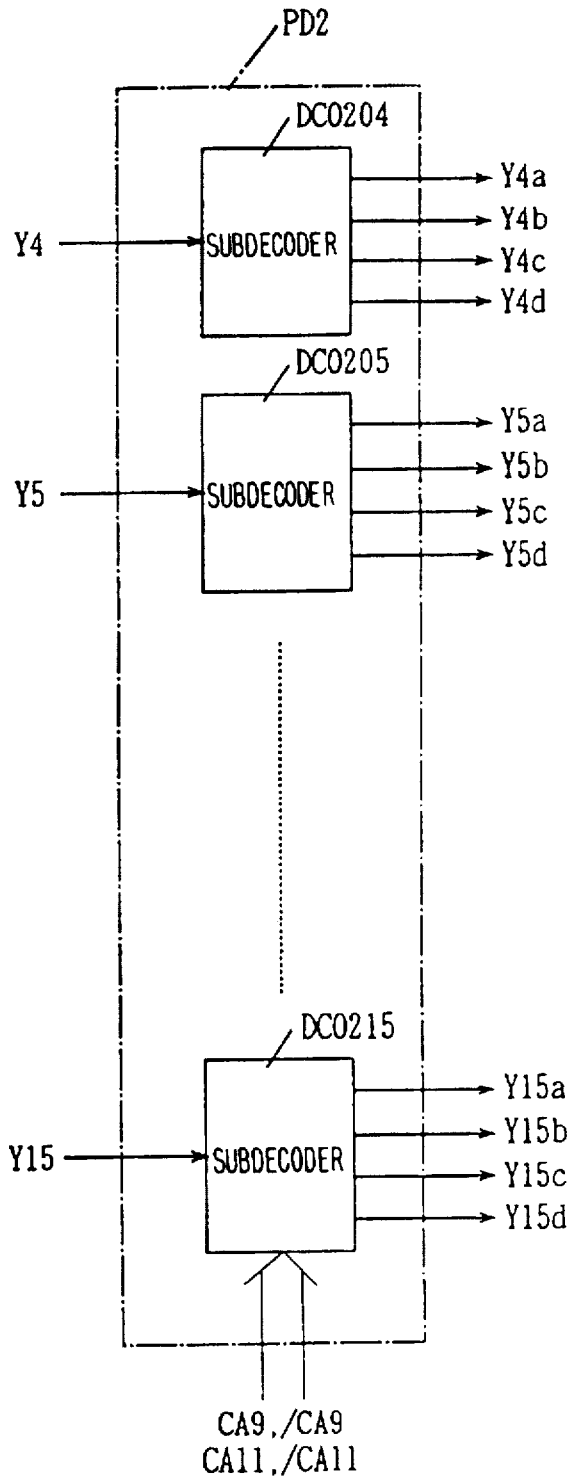
FIG. 3 is a block diagram illustrating a further detailed structure of the second predecoder in FIG. 1.

FIG. 1 is a block diagram illustrating a structure of a dynamic RAM according to an embodiment of the present invention. The embodiment illustrated in FIG. 1 shows only the structure of memory cell arrays and a column selecting system in the dynamic RAM for the sake of simplicity of description. The structure of the embodiment illustrated in FIG. 1 is the same as the structure of a conventional dynamic RAM illustrated in FIG. 12 except for the following respects, so that the corresponding parts are given the same reference numerals and description of them will not be repeated. Signals CA2, /CA2–CA7, /CA7 out of a plurality of signals (see FIG. 13) provided from a column address buffer CAB are applied to a first predecoder PD1. As illustrated in FIG. 2, first predecoder PD1 includes a plurality of subdecoders DCO11–DCO13 and generates predecoded signals Y4–Y15 on the basis of the signals applied from column address buffer CAB. For example, subdecoder DCO11 renders one of predecoded signals Y4–Y7 active for example, at a high or "H" level in accordance with combination of the logics of signals CA2, /CA2, CA3, and /CA3. The other subdecoders DCO12, DCO13 operate in the same way. The above-described predecoded signals Y4–Y15 are applied to a second predecoder P2. Signals CA9, /CA9, CA11, /CA11 are further applied from column address buffer CAB to second predecoder PD2. As illustrated in FIG. 3, second predecoder PD2 includes a plurality of subdecoders DCO204–DCO215 and generates predecoded signals Y4a–Y15a, Y4b–Y15b, Y4c–Y15c, and Y4d–Y15d. For example, when predecoded signal Y4 is in an active state (for example, at "H" level), subdecoder DCO204 brings one of predecoded signals Y4a, Y4b, Y4c, Y4d into an active state (for example, "H" level) in accordance with combination of the logics of signals CA9, /CA9, CA11, and /CA11. The other subdecoders DCO205–DCO215 operate in the same way.

Figure 4:
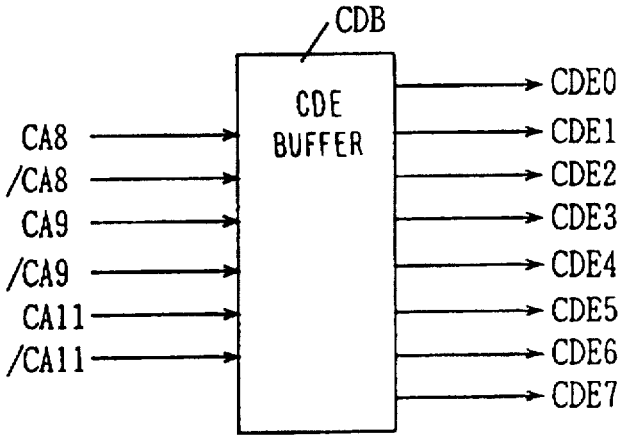
FIG. 4 is a block diagram illustrating a further detailed structure of the CDE buffer in FIG. 1.

Signals CA8, /CA8, CA9, /CA9, CA11, and /CA11 out of the plurality of output signals from column address buffer CAB are applied to a CDE buffer CDB. As illustrated in FIG. 4, CDE buffer CDB brings one of predecoded signals CDE0–CDE7 into an active state (for example, "H" level) in accordance with combination of the logics of signals CA8, /CA8, CA9, /CA9, CA11, and /CA11.

Figure 5:
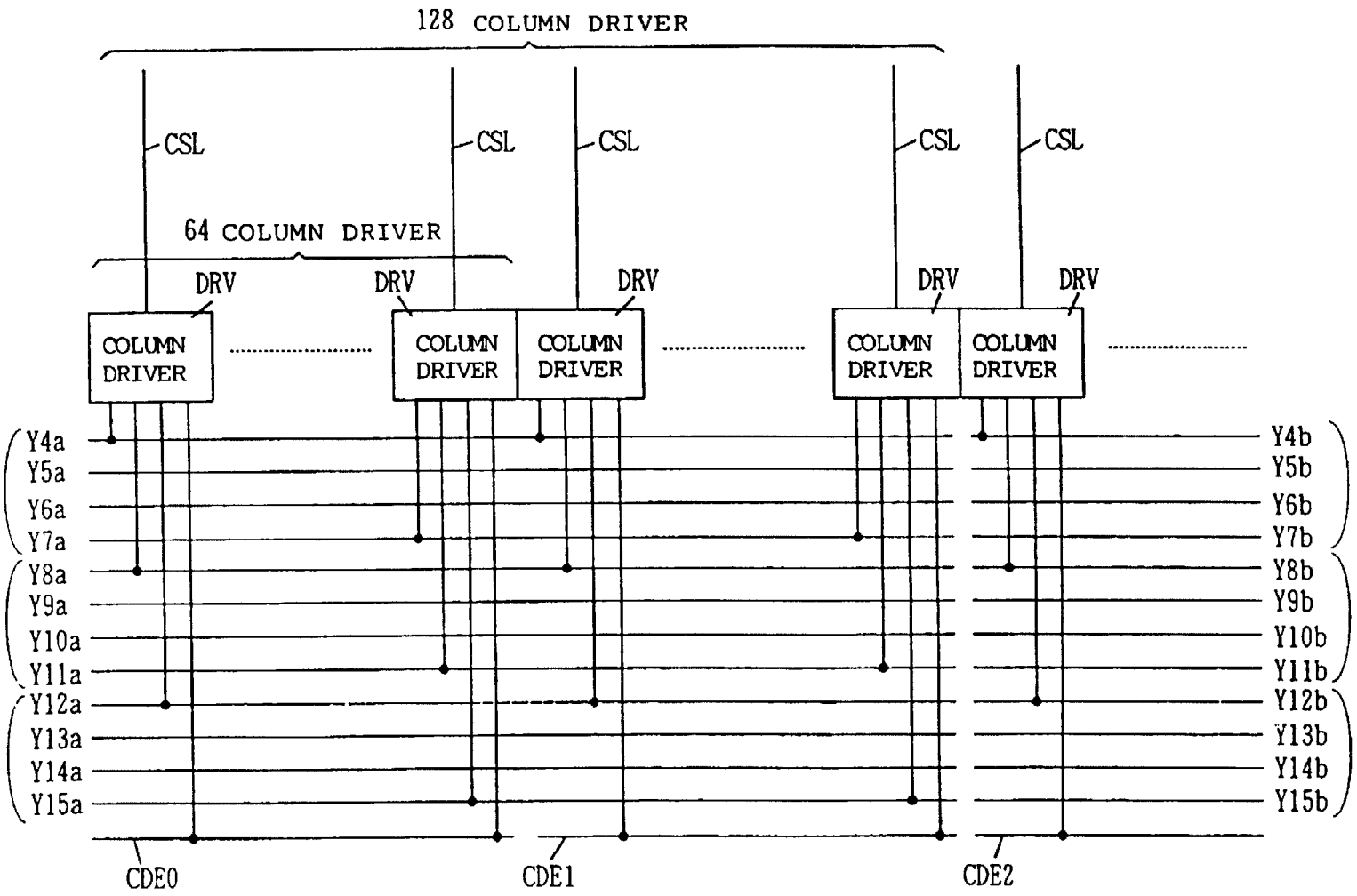
FIG. 5 is a block diagram illustrating a further detailed structure of the column decoder and its peripheral part in FIG. 1.
Figure 7:
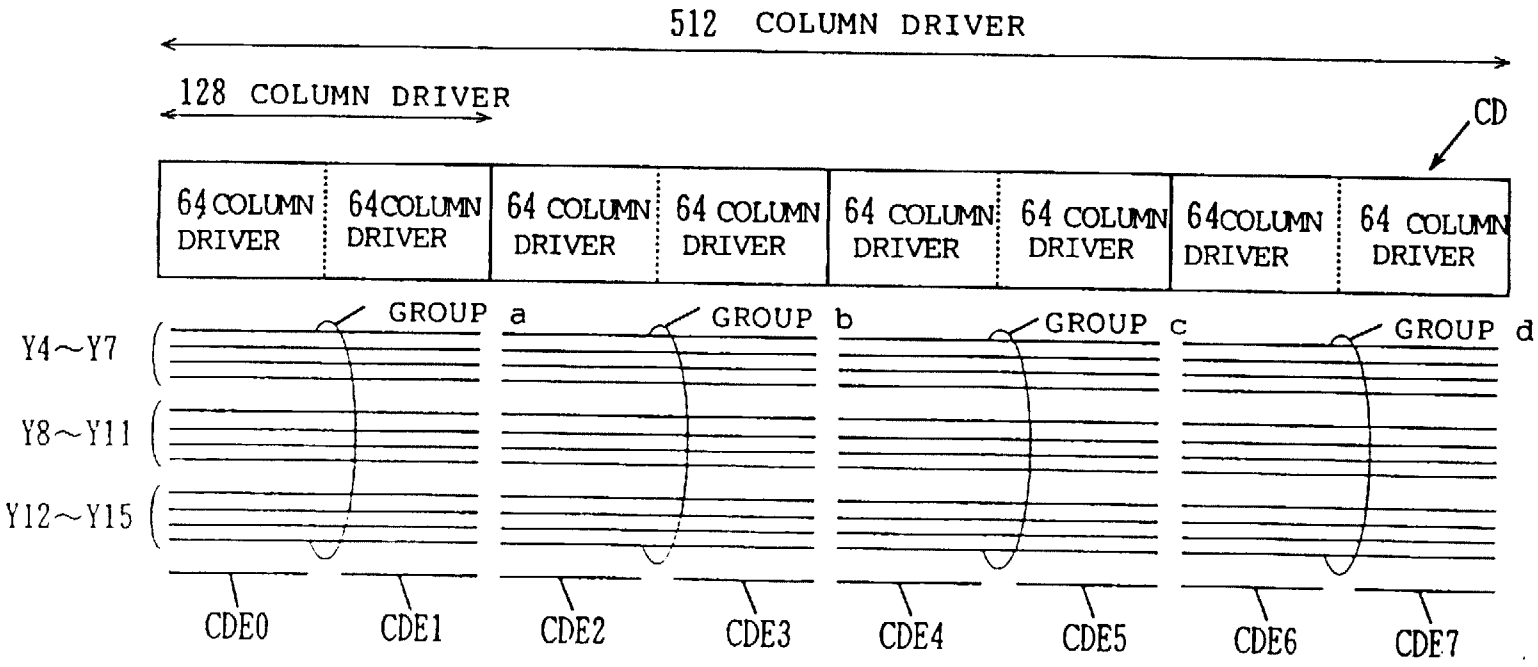
FIG. 7 is a diagram illustrating a wiring structure for the predecoded signals in the embodiment illustrated in FIG. 1.

Column decoder CD includes, for example, 512 column drivers DRV. As illustrated in FIGS. 5 and 7, 512 column drivers DRV are divided into four large groups (groups a–d) each including 128 column drivers, and each of groups a– d is further divided into two small groups each including 64 column drivers. The signal lines of predecoded signals Y4a–Y15a are distributed only to the lower side of the column drivers belonging to group a. Similarly, the signal lines of predecoded signals Y4b–Y15b are distributed only to the lower side of the column drivers belonging to group b, the signal lines of predecoded signals Y4c–Y15c are distributed only to the lower side of the column drivers belonging to group c, and the signal lines of predecoded signals Y4d–Y15d are distributed only to the lower side of the column drivers belonging to group d. For example, one of the signal lines of predecoded signals Y4a–Y7a, one of the signal lines of predecoded signals Y8a–Y11a, and one of the signal lines of predecoded signals Y12a–Y15a are connected to each column driver in group a. This is the same with the column drivers in the other groups.

On the other hand, signal lines of predecoded signals CDE0–CDE7 provided from CDE buffer CDB are distributed, respectively, to small groups each including 64 column drivers. Specifically, the signal line of predecoded signal CDE0 is distributed only to the lower side of the column drivers belonging to one small group in group a. The signal line of predecoded signal CDE1 is distributed only to the lower side of the column drivers belonging to the other small group in group a. This is the same with the other predecoded signals CDE2–CDE7.

Figure 6:
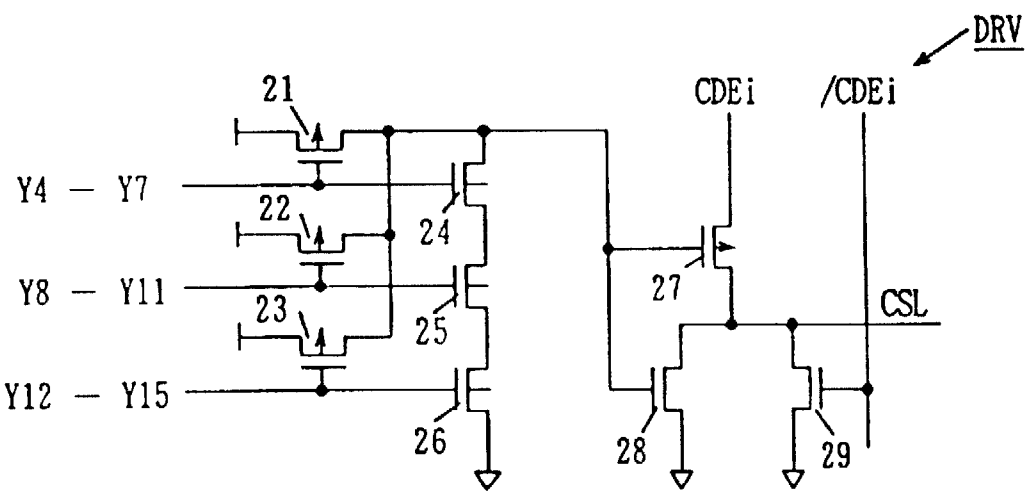
FIG. 6 is a circuit diagram illustrating a further detailed structure of the column driver include in the column decoder in FIG. 1.

As illustrated in FIG. 6, each column driver DRV is implemented with a P channel MOSFET 21–23 and 27 and N channel MOSFET 24–26, 28, and 29.

As described above, according to the embodiment illustrated in FIG. 1, second predecoder PD2 and CDE buffer CDB provide independent predecoded signals Y4a–Y15a, Y4b–Y15b, Y4c–Y15c, Y4d–Y15d, and CDE0–CDE7 for respective groups of column drivers DRV. As a result, as illustrated in FIG. 7, the signal line of each predecoded signal may be distributed only to the lower side of the column driver in a corresponding group. Accordingly, the length of wiring for each predecoded signal is shortened. Shortening the length of wiring makes capacitance of wiring smaller, so that it is possible to realize operation at a higher speed and lower power consumption. In addition, although distributing the signal lines of the predecoded signals to respective groups increases the number of the predecoded signals as a whole in comparison with that in the conventional semiconductor memory device illustrated in FIG. 12, the length of wiring for each predecoded signal is shortened, and wiring of each group can be arranged lined in a lateral direction along the length of column decoder CD to reduce the area of the layout of wiring as a whole in comparison with that in the conventional semiconductor memory device illustrated in FIG. 12. Furthermore, according to the embodiment illustrated in FIG. 1, CDE buffer CDB provides independent predecoded signals CDE0–CDE7, respectively, to small groups each including 64 column drivers, so that it is possible to distribute the signal lines of respective predecoded signals CDE0–CDE7 in a substantially straight line as illustrated in FIG. 7. This can further reduce the area of the layout for the predecoded signals.

Figure 8:
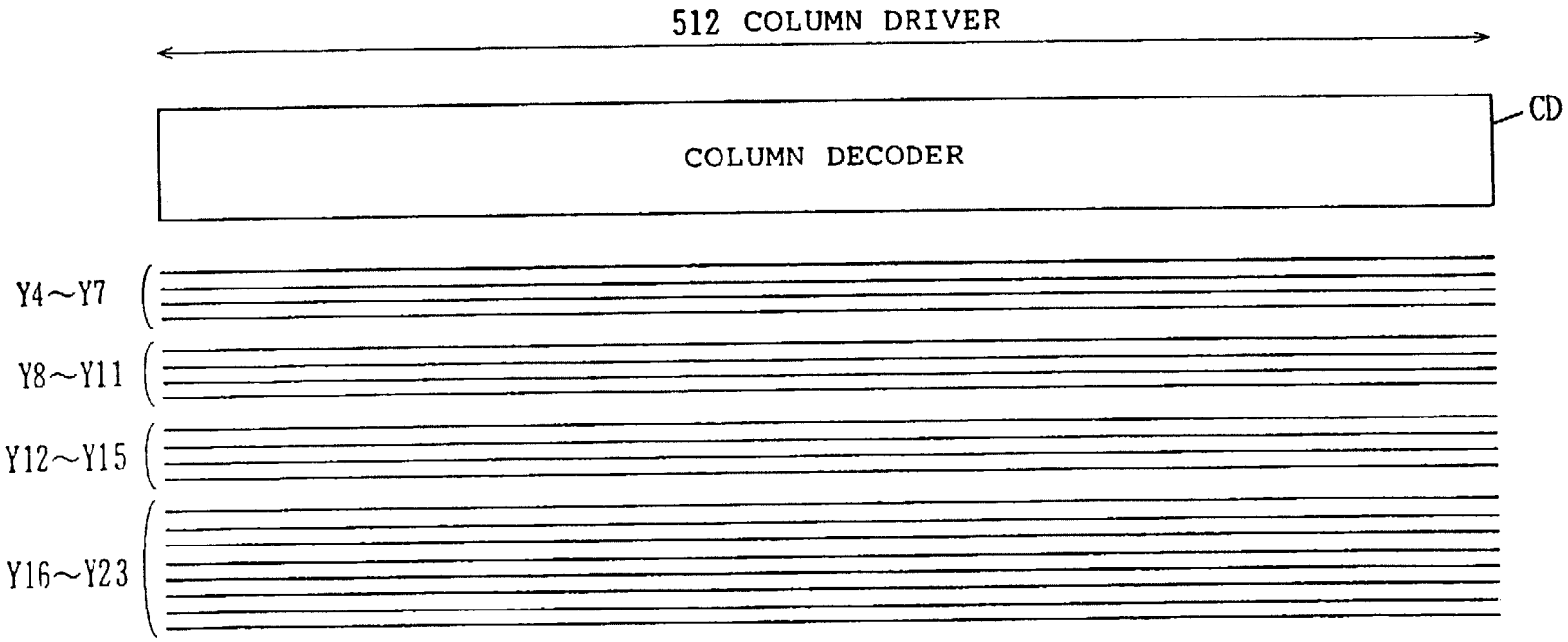
FIG. 8 is a diagram illustrating a wiring structure of the predecoded signal lines in the conventional semiconductor memory device illustrated in FIG. 12.
Figure 9:
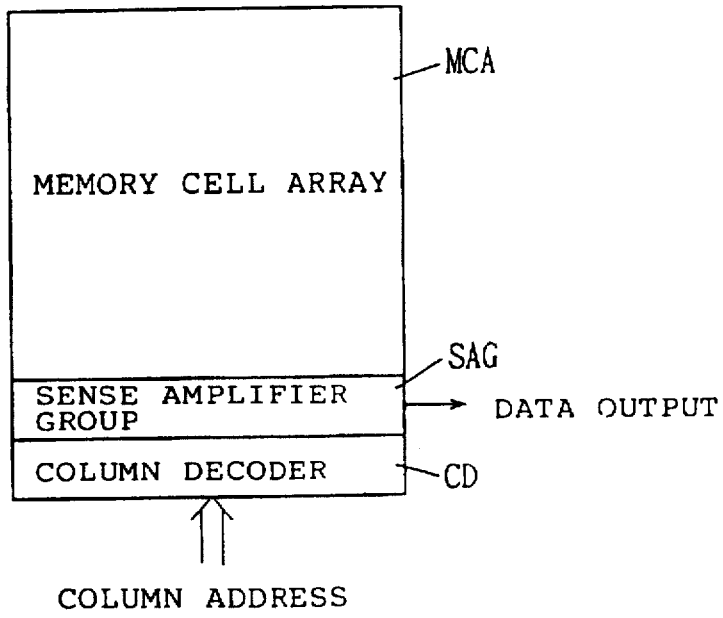
FIG. 9 PRIOR ART
FIG. 9 is a block diagram illustrating an example of a conventional semiconductor memory device.
Figure 10:
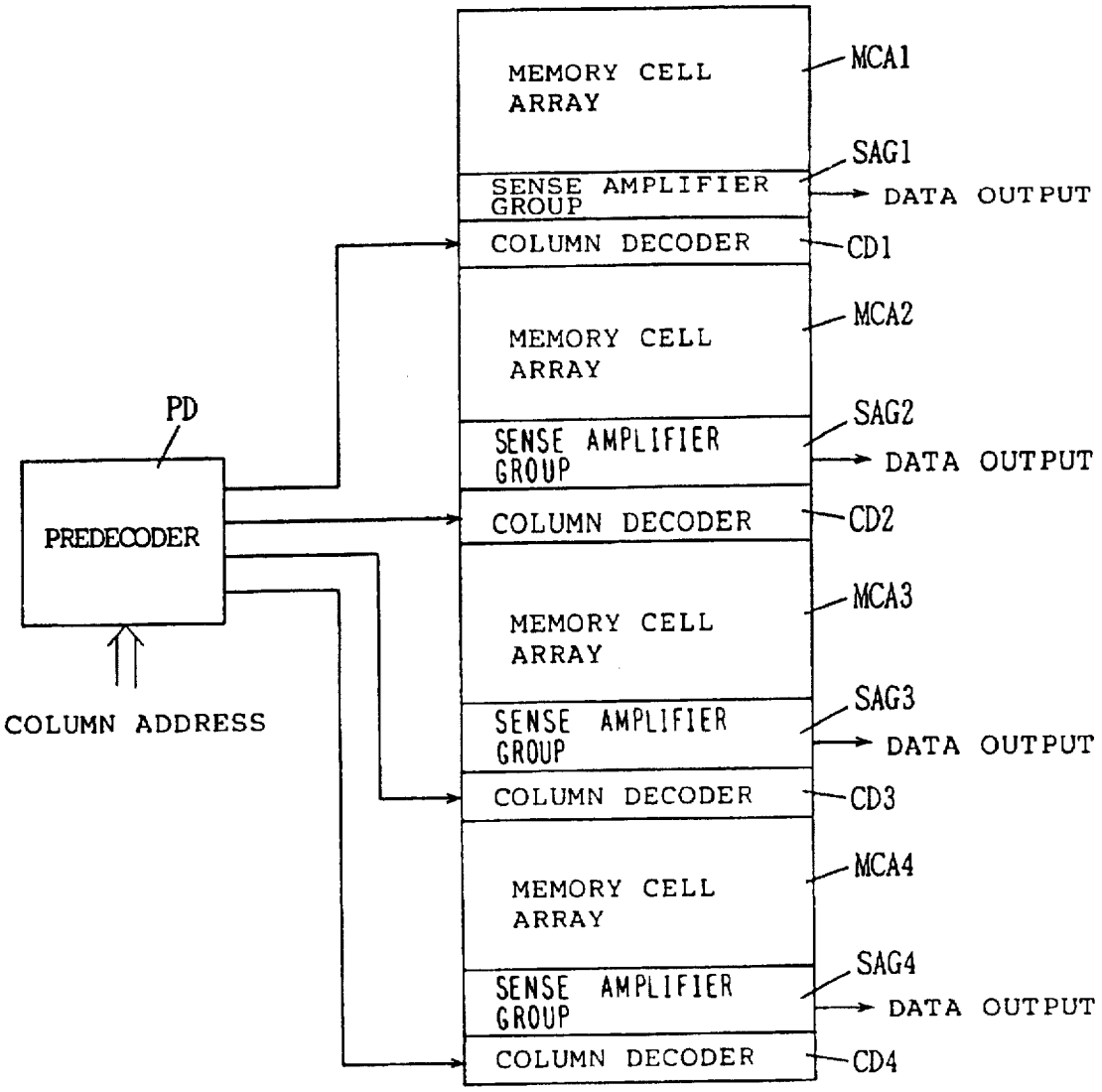
FIG. 10 PRIOR ART
FIG. 10 is a block diagram illustrating another example of a conventional semiconductor memory device.
Figure 11:
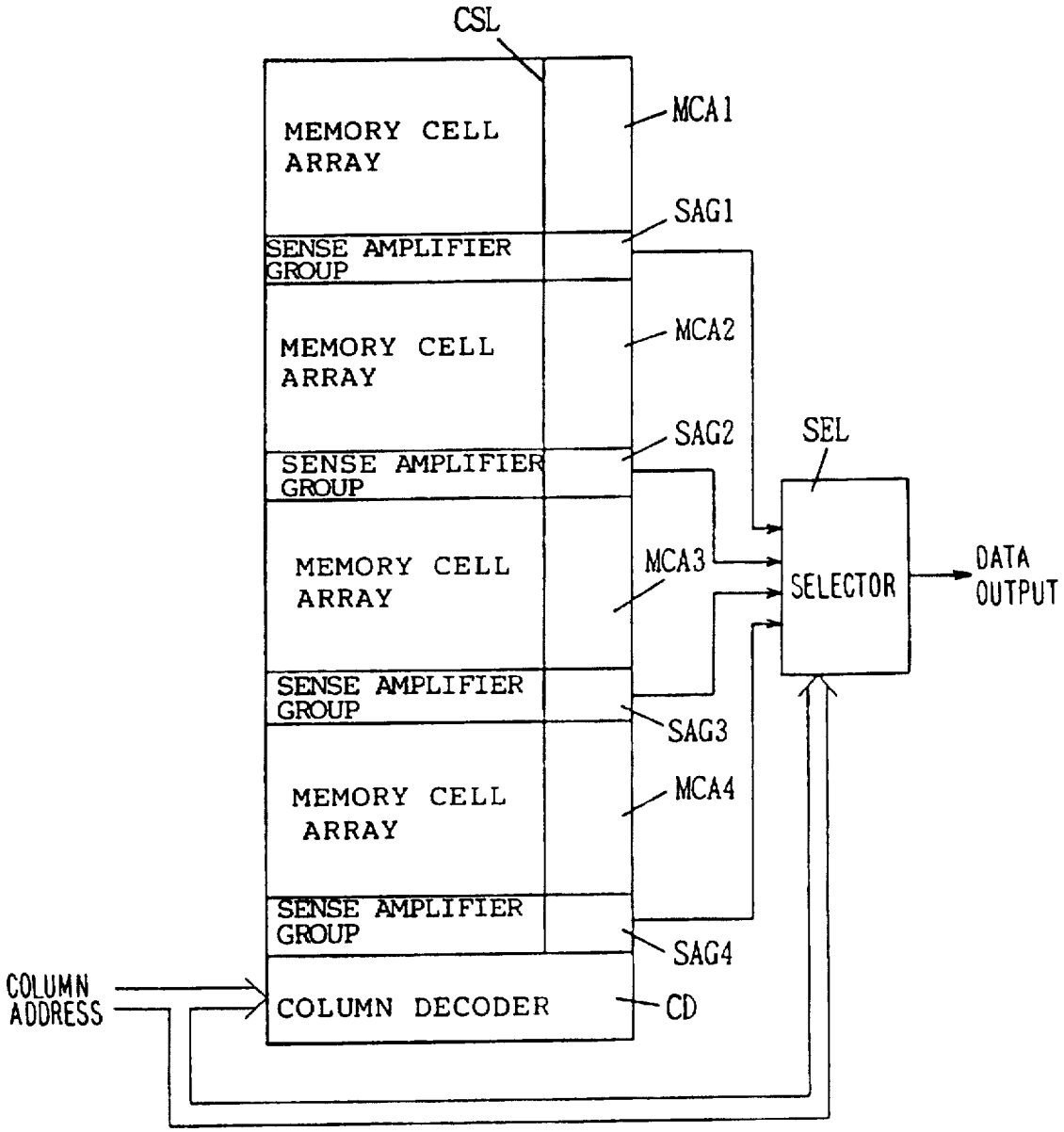
FIG.11 PRIOR ART
FIG. 11 is a block diagram illustrating still another example of a conventional semiconductor memory device.
Figure 12:
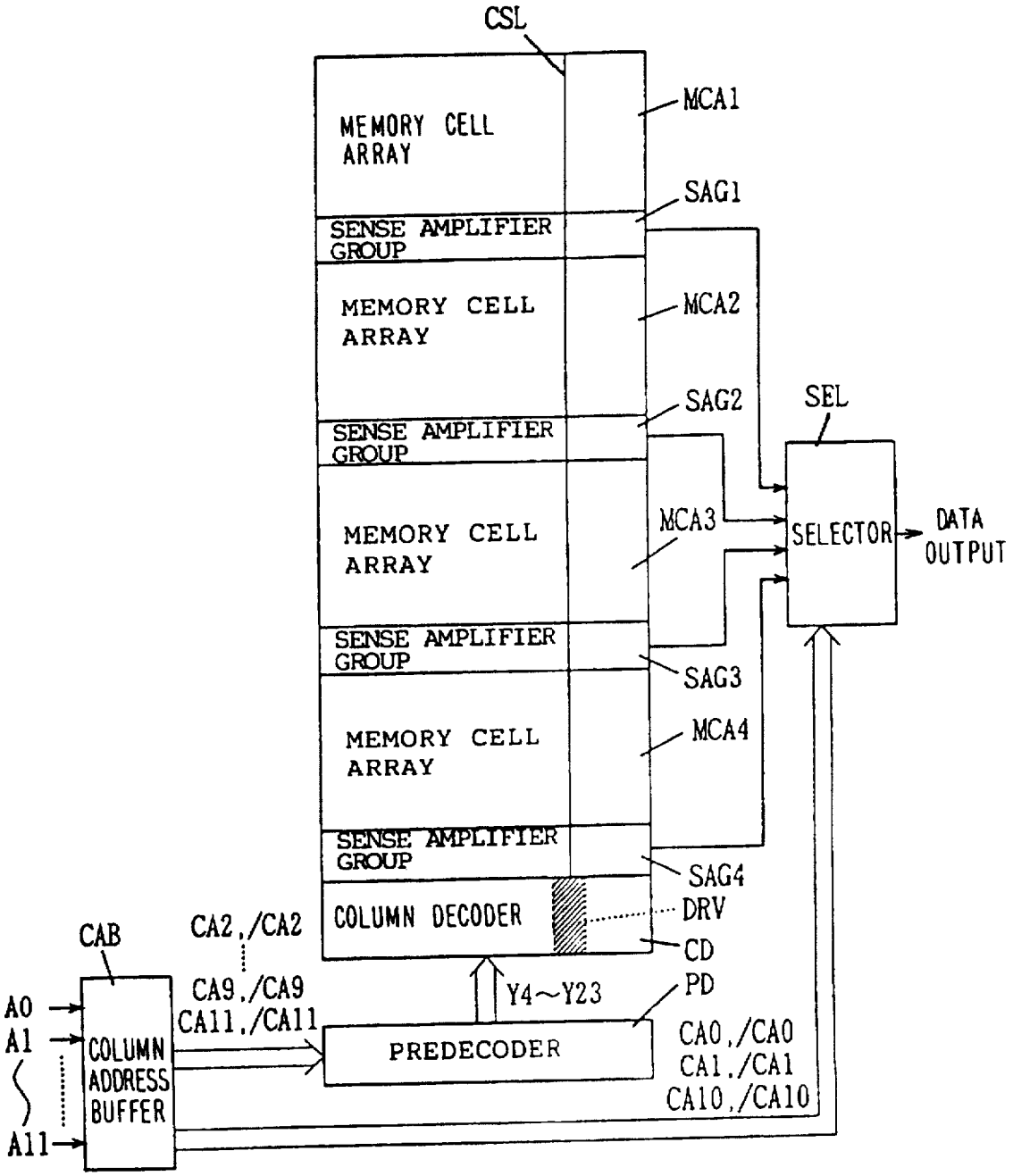
FIG. 12 PRIOR ART
FIG. 12 is a block diagram illustrating a further detailed structure of the semiconductor memory device illustrated in FIG. 11.
Figure 13:
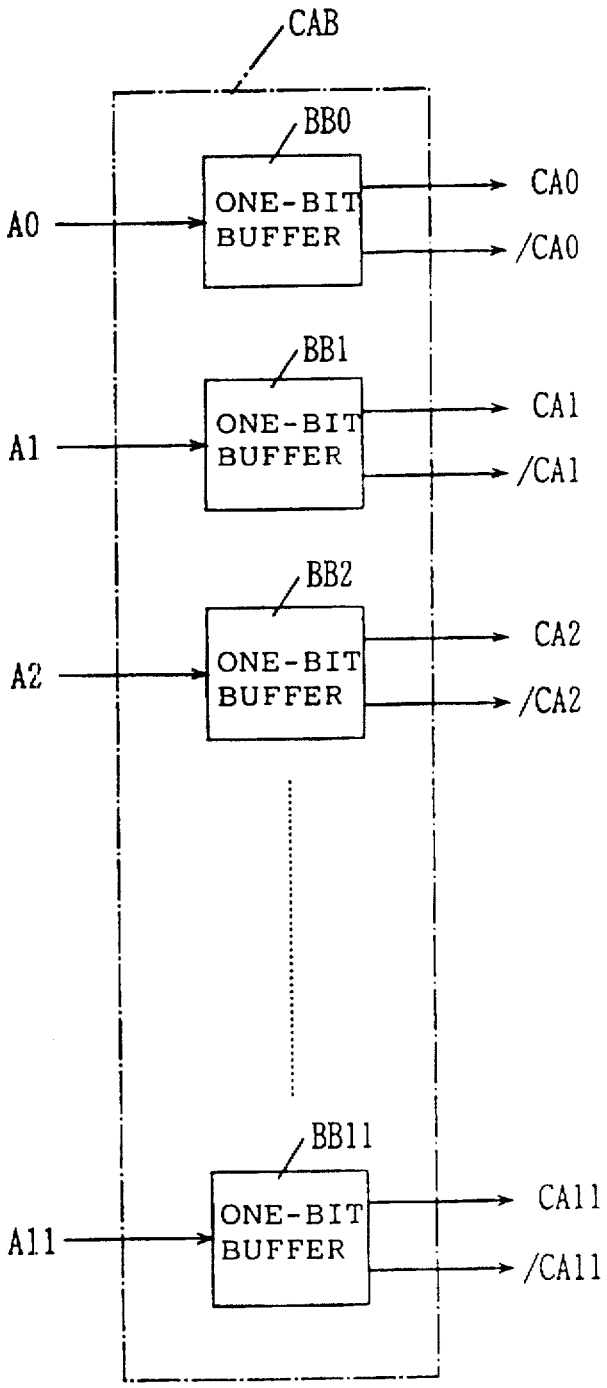
FIG. 13 PRIOR ART
FIG. 13 is a block diagram illustrating a further detailed structure of the column address buffer in FIG. 12.
Figure 14:
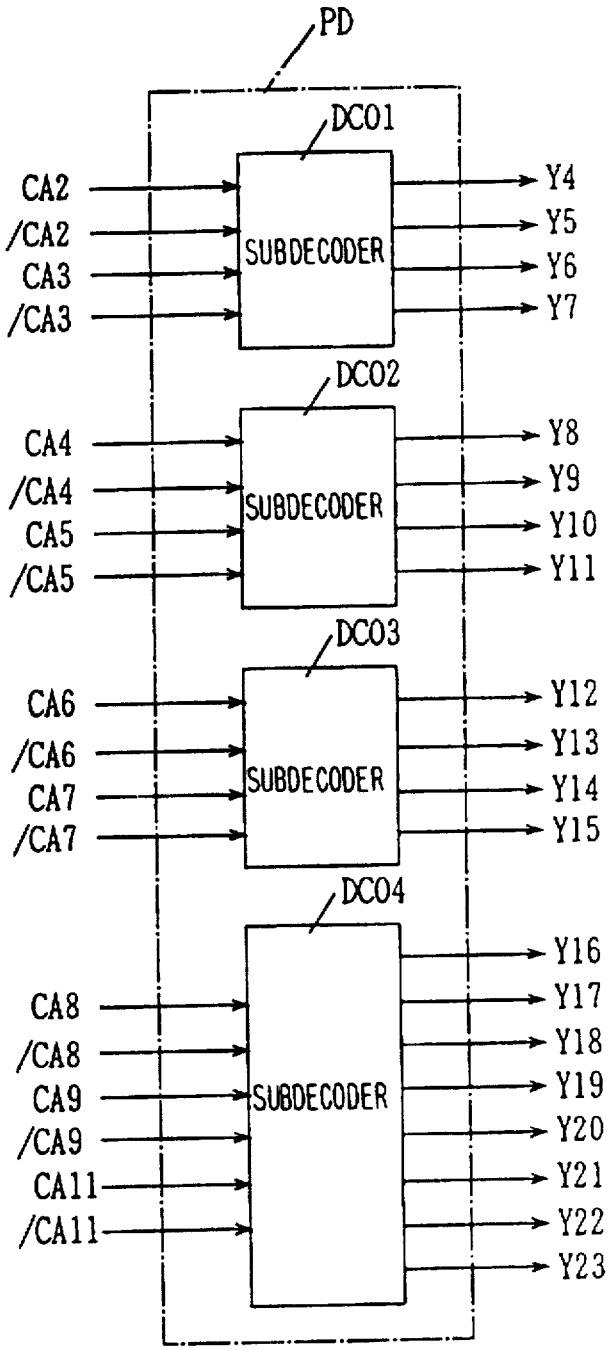
FIG. 14 PRIOR ART
FIG. 14 is a block diagram illustrating a further detailed structure of the predecoder in FIG. 12.
Figure 15:
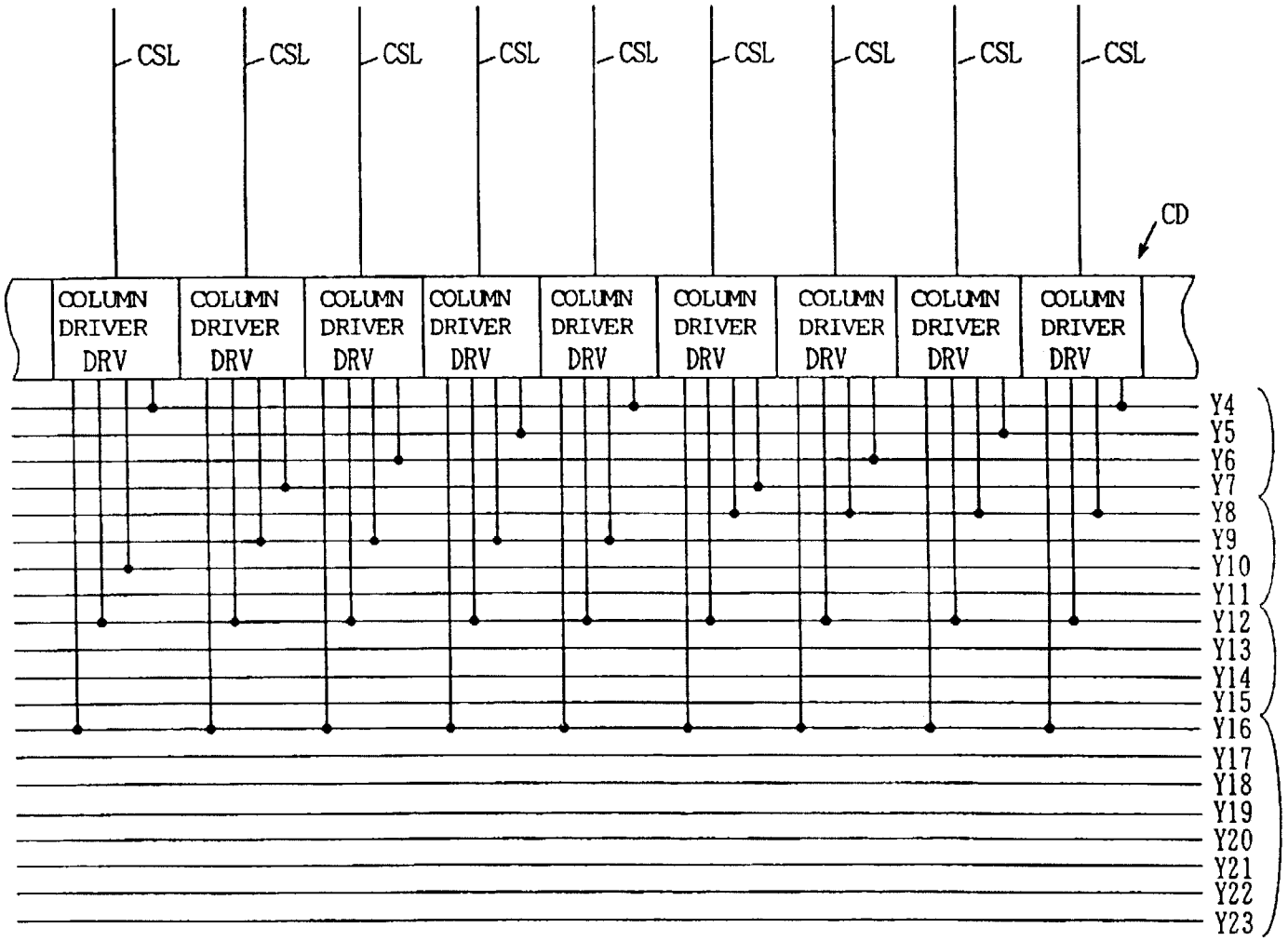
FIG. 15 PRIOR ART
FIG. 15 is a block diagram illustrating a further detailed structure of the column decoder and its peripheral part in FIG. 12.
Figure 16:
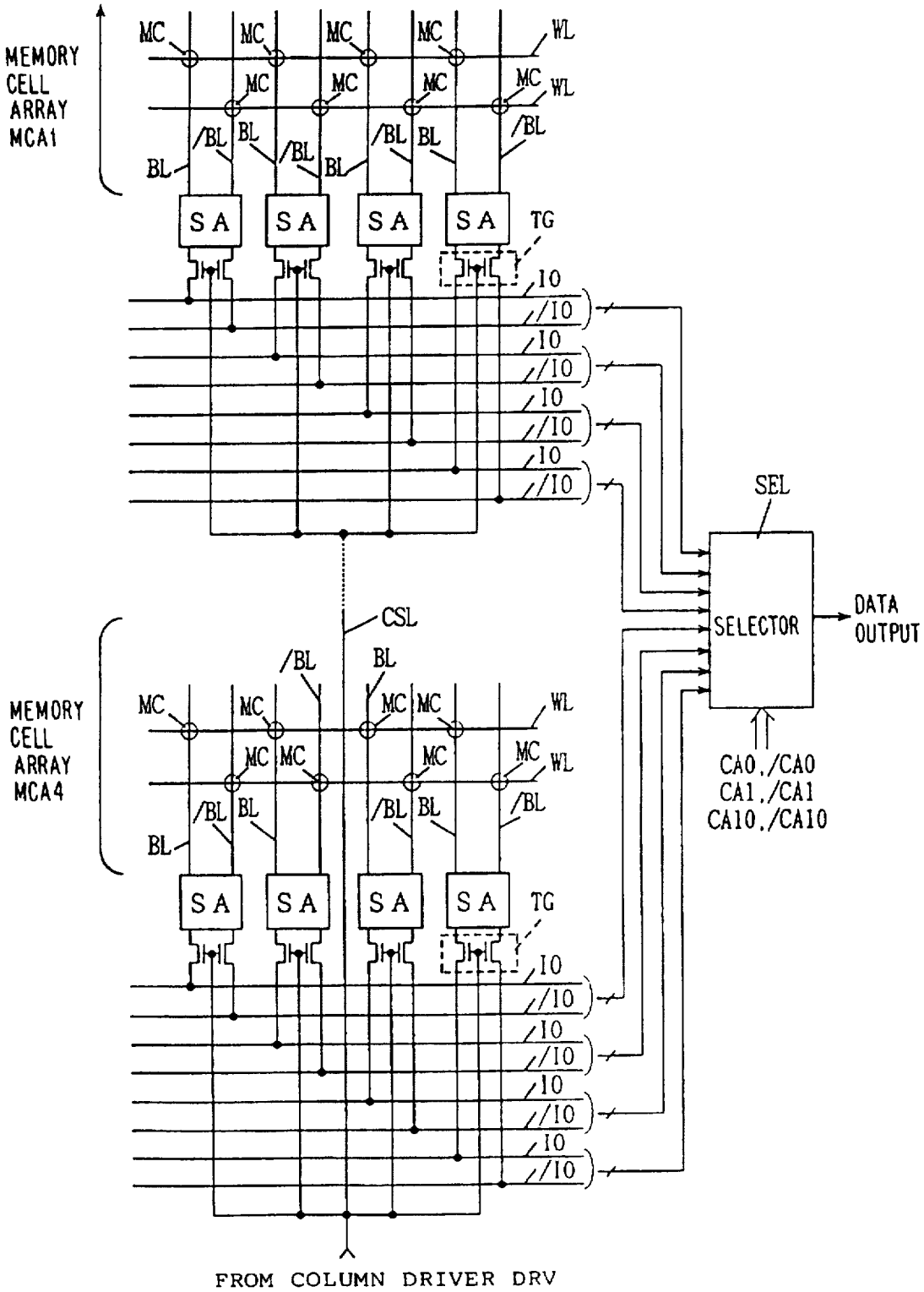
FIG. 16 PRIOR ART
FIG. 16 is a block diagram illustrating details of a structure related to one column selecting line in the conventional semiconductor memory device illustrated in FIG. 12.

On the other hand, it is seen that the conventional semiconductor memory device illustrated in FIG. 12 has the signal lines of all predecoded signals Y4–Y23 distributed over the whole length of column decoder CD as illustrated in FIG. 8, so that the length of wiring and the area of the layout are increased in comparison with those of the wiring structure (see FIG. 7) in the semiconductor memory device of the above embodiment.

While an embodiment of a dynamic RAM has been described above, the present invention is applicable to a static RAM or an EEPROM.

The number of the column drivers included in column decoder CD may be arbitrarily changed in accordance with the size of the memory cell array.

Furthermore, while column drivers DRV in column decoder CD are divided into four groups a–d in the above embodiment, the number of groups is not limited to four and may be any. In addition, while each of groups a–d is further divided into smaller groups, and the wiring structure for the predecoded signals is implemented in two hierarchies, larger groups and smaller groups, in the above embodiment, it may be implemented without such hierarchies, or it may be implemented in more hierarchies. Even if the wiring structure for the predecoded signals are not implemented in hierarchies, it is still possible to reduce the area of the layout. In a case where the signal lines of the predecoded signals are not implemented in hierarchies, the signal lines of predecoded signals CDE0 and CDE1 are arranged parallel to each other in group a, for example.

Furthermore, while the number of the bit line pairs in each memory cell array which are selected by one column selecting line CSL is four in the above embodiment, it may be any other number.

As described above, according to the present invention, the length of wiring for each predecoded signal is shortened, so that it is possible to realize a reduced area of a layout, operation at a higher speed, and reduced power consumption.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A column selecting circuit for selecting a bit line in a semiconductor memory device comprising a memory cell array divided into a plurality of blocks, each of said blocks of said memory cell array including a plurality of word lines, a plurality of bit lines arranged crossing said word lines, and a plurality of memory cells arranged at respective crossings of said word lines and said bit lines, said column selecting circuit comprising:

a plurality of column selecting lines for applying a selecting signal in common to corresponding bit lines of said memory cell array;

predecode means for predecoding an applied column address signal to provide a plurality of predecoded signals;

column decode means for decoding said predecoded signals to select one of said plurality of column selecting lines; and wiring means for transmitting said predecoded signals to said column decode means;

said column decode means including a plurality of selecting signal providing means provided respectively for said plurality of column selecting lines for providing selecting signals to corresponding column selecting lines, respectively;

said plurality of selecting signal providing means being divided into a plurality of adjacent groups each including an equal number, greater than one, of said plurality of selecting signal providing means;

said predecode means providing independent predecoded signals for said respective groups of said plurality of selecting signal providing means; and said wiring means having a wiring structure divided between said groups of said plurality of selecting signal providing means.

2. The column selecting circuit in a semiconductor memory device according to claim 1, wherein said plurality of groups of said plurality of selecting signal providing means are divided into a plurality of sub-groups;

said predecode means provides independent predecoded signals for said respective groups and for said respective sub-groups; and said wiring means has a wiring structure implemented in hierarchies for transmitting said predecoded signals to said respective groups and to said respective sub-groups of said plurality of selecting signal providing means.

3. The column selecting circuit in a semiconductor memory device according to claim 2, wherein said plurality of sub-groups is implemented by subdividing each group of said plurality of groups; and said wiring means has a part of it divided for respective groups and the rest of it divided for respective sub-groups.

4. The column selecting circuit in a semiconductor memory device according to claim 3, wherein said predecode means includes predecode means for said first hierarchy for generating independent predecoded signals for respective groups of said first hierarchy and predecode means for said second hierarchy for generating independent predecoded signals for respective groups of said second hierarchy.

5. For a memory cell array including a plurality of rows and columns of memory cells, a column selecting arrangement comprising:

a plurality of column driver circuits each uniquely corresponding to a set of memory cell columns and including input terminals for accessing said set of memory cell columns in response to signals received at said input terminals, said plurality of column driver circuits being divided into a plurality of adjacent groups each including an equal number, greater than one, of said plurality of column driver circuits, predecoder means responsive to an address input for generating a plurality of predecoded signals at a plurality of predecoder output terminals, connecting means for mutually exclusively connecting groups of said predecoder output terminals to corresponding groups of said column driver circuits, and column decoder buffer means including a predetermined number of buffer output terminals corresponding to each group of column driver circuits for applying a column decoder buffer output signal to input terminals of corresponding column driver circuits in response to said address input.

6. A column selecting arrangement according to claim 5, further comprising selector means for selecting one column from a set of memory columns accessed by one of said column driver circuits.

7. A column selecting arrangement according to claim 5, wherein each group of column driver circuits is divided into a plurality of subgroups, an input terminal of each column driver circuit of each subgroup connected to one of said buffer output terminals, each buffer output terminal corresponding to a respective subgroup.

8. A column selecting arrangement according to claim 5, wherein said memory array is divided into a plurality of blocks having corresponding memory cell columns accessable by said column driver circuits.

9. A semiconductor memory device including a memory cell array having a plurality of rows and columns of memory cells divided into a plurality of blocks, and a column selecting arrangement comprising:

a plurality of circuit driver circuits each uniquely corresponding to a set of memory cell columns in each block and including input terminals for accessing said set of memory columns in each block in response to signals received at said input terminals, said plurality of column driver circuits being divided into a plurality of adjacent groups each including an equal number, greater than one, of aid plurality of column driver circuits, predecoder means responsive to an address input for generating a plurality of predecoded signals at a plurality of predecoder output terminals, connecting means for mutually exclusively connecting groups of said predecoder output terminals to corresponding groups of said column driver circuits, and column decoder buffer means including a predetermined number of buffer output terminals corresponding to each said group of column driver circuits for applying a column decoder buffer output signal to input terminals of corresponding column driver circuits in response to said address input.

10. A column selecting circuit for selecting a bit line in a semiconductor memory device comprising a memory cell array divided into a plurality of blocks, each of said blocks of said memory cell array including a plurality of word lines, a plurality of bit lines arranged crossing said word lines, and a plurality of memory cells arranged at respective crossings of said word lines and said bit lines, said column selecting circuit comprising:

a plurality of column selecting lines for applying a selecting signal in common to corresponding bit lines of said memory cell array;

predecode means for predecoding an applied column address signal to provide a plurality of predecoded signals;

column decode means for decoding said predecoded signals to select one of said plurality of column selecting lines; and wiring means for transmitting said predecoded signals to said column decode means;

said column decode means including a plurality of selecting signal providing means provided respectively for said plurality of column selecting lines for providing selecting signals to corresponding column selecting lines, respectively;

said plurality of selecting signal providing means being divided into a first hierarchy of selecting signal providing means and a second hierarchy of selecting signal providing means, said first hierarchy of selecting signal providing means including at least one group having a first number of selecting signal providing means, said second hierarchy of selecting signal providing means including a plurality of groups each having a second number of selecting signal providing means, said first number of selecting signal providing means being greater than said second number of selecting signal providing means;

said predecode means providing independent predecoded signals for each group in the first hierarchy of selecting signal providing means and for each group in the second hierarchy of selecting signal providing means; and said wiring means having a wiring structure for transmitting predecoded signals to each group of said plurality of selecting signal providing means in the first hierarchy and each group of said plurality of selecting signal providing means in the second hierarchy.

11. The column selecting circuit in a semiconductor memory device according to claim 10, wherein said plurality of groups of said second hierarchy is implemented by subdividing each group of said first hierarchy of selecting signal providing means; and said wiring means has a part of it divided for each groups in said first hierarchy and the rest of it divided for each group in said second hierarchy of selecting signal providing means.

12. The column selecting circuit in a semiconductor memory device according to claim 11, wherein said predecode means includes predecode means for said first hierarchy of selecting signal providing means for generating independent predecoded signals for each group of said first hierarchy of selecting signal providing means and predecode means for said second hierarchy of selecting signal providing means for generating independent predecoded signals for each group of said second hierarchy of selecting signal providing means.

*13. A semiconductor memory device, comprising:*

*a memory cell array having a plurality of blocks each including a plurality of memory cells;*

*a plurality of selecting lines for selecting a prescribed number of memory cells in each of said plurality of blocks;*

*predecode means for predecoding an applied address signal and for outputting a plurality of predecoded signals;*

*decode means for decoding said predecoded signals and for selectively driving a prescribed one of said plurality of selecting lines; and*

*predecoded signal wirings for transmitting said predecoded signals to said decode means; wherein*

*said decode means includes a plurality of selecting line driving means provided for said plurality of selecting lines respectively, each for driving the corresponding selecting line, said plurality of selecting line driving means being divided into a plurality of groups,*

*said predecode means outputs said predecoded signals independent from group to group of said plurality of selecting line driving means, and*

*said predecoded signal wirings have a structure divided corresponding to group by group of said plurality of selecting line driving means.*

*14. The semiconductor memory device according to claim 13, wherein*

*said predecode means includes a plural stages of predecoders for hierarchically predecoding said address signal.*

*15. A semiconductor device, comprising:*

*a memory cell array having a plurality of memory cells;*

*a plurality of selecting lines for selecting a prescribed number of memory cells in the memory cell array;*

*a band of predecoded signal wirings having a plurality of wiring groups arranged along a first direction, in each of which group a plurality of predecoded signal wirings parallel to the first direction are arranged along a second direction orthogonal to the first direction; and*

*a plurality of selecting line driving means provided for said plurality of selecting lines respectively and arranged along said first direction, said plurality of selecting line driving means being divided into a plurality of groups corresponding to said plurality of wiring groups of said predecoded signal wiring band, the plurality of selecting line driving means of each group of the selecting line driving means being connected to prescribed ones of the plurality of predecoded signal wirings in the corresponding wiring group, for driving a corresponding selecting line based on the predecoded signals transmitted through the connected predecoded signal wirings.*

*16. A semiconductor memory device, comprising:*

*a memory cell array having a plurality of memory cells;*

*a plurality of selecting lines for selecting a prescribed number of memory cells in the memory cell array;*

*a first band of predecoded signal wirings having a plurality of first wiring groups arranged along a first direction, in each of which group a plurality of first predecoded signal wirings parallel to the first direction are arranged along a second direction orthogonal to the first direction;*

*a second band of predecoded signal wirings having a second group of wirings or a plurality of second groups*

*of wirings arranged along the second direction, in each of which group a plurality of second predecoded signal wirings parallel to the first direction are arranged along the first direction; and*

*a plurality of selecting line driving means provided for said plurality of selecting lines respectively and arranged along said first direction, said plurality of selecting line driving means being divided into a plurality of groups corresponding to said plurality of first wiring groups of said first band of predecoded signal wirings, the plurality of selecting line driving means of each group of the selecting line driving means being connected to prescribed first ones of the plurality of first predecoded signal wirings in the corresponding first group of wirings and to corresponding second predecoded signal wirings of the second band of predecoded signal wirings, for driving a corresponding selecting line based on the predecoded signals transmitted through the connected first and second predecoded signal wirings.*

*17. The semiconductor memory device according to claim 16, wherein*

*different said selecting line driving means are connected to different first predecoded signal wirings or to different combination of the first predecoded signal wirings and connected to a common second predecoded signal wiring in respective ones of said groups of selecting line driving means.*

* * * * *